United States Patent [19]

Verhaar

[11] Patent Number: 5,015,599
[45] Date of Patent: May 14, 1991

[54] METHOD OF MANUFACTURING A DEVICE COMPRISING MIS TRANSISTORS HAVING A PROJECTING GATE ON THE WEAKLY DOPED PARTS OF SOURCE AND DRAIN REGIONS

[75] Inventor: Robertus D. J. Verhaar, Eindhoven, Netherlands

[73] Assignee: U.S. Philips Corporation, Tarrytown, N.Y.

[21] Appl. No.: 588,118

[22] Filed: Sep. 25, 1990

[30] Foreign Application Priority Data

Nov. 3, 1989 [FR] France .................. 89 14434

[51] Int. Cl.$^5$ .......................... H01L 21/265
[52] U.S. Cl. ...................... 437/44; 437/41; 437/233; 437/191; 357/23.3; 156/643
[58] Field of Search .......... 437/40, 41, 44, 46, 437/189, 190, 191, 233, 238; 148/DIG. 122; 156/643; 357/23.3

[56] References Cited

U.S. PATENT DOCUMENTS

| | | | |
|---|---|---|---|
| 4,818,715 | 4/1989 | Chao | 437/44 |
| 4,837,180 | 6/1989 | Chao | 437/44 |
| 4,906,589 | 3/1990 | Chao | 437/44 |
| 4,907,048 | 3/1990 | Huang | 357/23.3 |
| 4,925,807 | 5/1990 | Yoshikawa | 437/41 |
| 4,963,504 | 10/1990 | Huang | 437/41 |
| 4,971,922 | 11/1990 | Watabe et al. | 437/233 |

OTHER PUBLICATIONS

Huang et al., "A Novel Submicron LDD Transistor with Inverse T-Gate Structure", IEDM, 1986, pp. 742-745.

Izawa et al., "The Impact of Gate-Drain Overlapped LDD (GOLD) for Deep Submicron VLSI's", IEDM 1987, pp. 38-41.

Primary Examiner—Olik Chaudhuri
Assistant Examiner—M. Wilczewski
Attorney, Agent, or Firm—Paul R. Miller

[57] ABSTRACT

Method is set forth of manufacturing a device comprising MIS transistors having a projecting gate on the weakly doped parts of source and drain regions.

A method comprising the deposition of a first and a second polycrystalline conducting layer, which are separated by an insulating layer.

According to the invention, gate islands (20) are formed in the second polycrystalline layer (14) and the ion implantation of the weakly doped portions (21, 22) of the source and drain zones is effected through the assembly of the insulating layer (13) and the first polycrystalline layer (12). A third polycrystalline layer (23) is then deposited, which layer contacts both the island of the second polycrystalline layer (14) and the first polycrystalline layer (12). Widened gate islands (26) are finally marked off by means of the insulating spacer technique (25), in which islands there remain only present the portions (23') of the third polycrystalline layer (23) in the shape of an "L". The highly doped portions (28, 29) of the source and drain zones are then implanted.

18 Claims, 3 Drawing Sheets

METHOD OF MANUFACTURING A DEVICE COMPRISING MIS TRANSISTORS HAVING A PROJECTING GATE ON THE WEAKLY DOPED PARTS OF SOURCE AND DRAIN REGIONS

FIELD OF THE INVENTION

The invention relates to a method of manufacturing a semiconductor device comprising at least one transistor of the MIS type having a drain region and a source region each comprising a weakly doped part and a highly doped part slightly offset laterally with respect to the preceding part as well as a gate electrode covering the weakly doped part and extending laterally to the highly doped part, in which method there are successively effected on a semiconductor body covered by an insulating gate layer:

- a deposition of a first polycrystalline layer rendered conducting by doping,
- the formation of a first insulating thin layer for later use as an etch stopper,
- a deposition of a second polycrystalline conducting layer which is thicker than the first polycrystalline layer,
- the formation of a second insulating layer which is thicker than the first insulating layer,
- the definition of gate islands by local etching of the second insulating layer and of the second polycrystalline layer outside the islands,
- the ion implantation of the weakly doped parts of the source and drain regions while using the gate islands as an implantation mask,
- the formation of insulating spacers on the edges of the gate islands by a deposition of a third insulating layer followed by an anisotropic etching of the major part of this layer, the insulating spacers limiting at their periphery widened gate islands,
- the removal by selective etching of the polycrystalline material exposed outside the widened gate islands,
- the ion implantation of the highly doped parts of the source and drain regions while using the widened gate islands as an implantation mask, and then
- the operations of finishing the device necessary for providing the contact connections and the interconnection with the active regions and with the gates of the transistors.

BACKGROUND

An MIS transistor having a projecting gate (also designated as a gate in the form of an inverted T) is known from the publication "Impact of the Gate-Drain Overlapped Device (GOLD) for deep submicrometer VLSI" by R. Izawa, T. Kure and E. Takeda in the magazine I.E.E.E. Transactions on Electron Devices, V. 35, No. 12, December 1988.

A method of manufacturing a transistor of this type intended to constitute integrated circuits having a very high integration density is also indicated in the same publication.

The authors have shown that the limitation of the performances of the MIS transistors of submicron dimensions with respect to the drain breakdown voltage, to the emission of hot carriers and/or to the insufficient transconductance could be obviated by the use of a gate electrode covering the weakly doped parts of the source and drain regions an extending in the direction of the highly doped parts of the regions over a distance which must be optimized.

The gate of the transistors is formed from two distinct layers of polycrystalline silicon so as to obtain the characteristic form of an inverted T. According to the known method, these two polycrystalline layers are separated by an extremely thin oxide layer, of the order of 0.5 to 1 nm thickness, in such a manner that this layer can serve as a reference for the stopping of etching the second polycrystalline layer during the formation of the gate islands, but nevertheless ensures sufficient electrical conduction between the first and the second polycrystalline layer in the interior other widened gate island of the finished device.

A disadvantage inherent in the known method resides in the difficulty to obtain in a reproducible manner an oxide layer having a equally small thickness, which requires a very narrow compromise between the effectiveness of its etch stopper function and a fairly high electrical conduction of this layer so as not to induce parasitic effects in the operation of the transistors and more particularly in the effectiveness of the transmission of the voltages to the lower part of the gates in a wide frequency spectrum.

The invention proposes a modification of the known method in order to avoid the disadvantage mentioned. It is based on the idea that the electrical conduction between the first and the second polycrystalline layer in the interior of the widened gate island of the finished device could be obtained by means independent of the thickness of the so-called first insulating layer and that thus there is a freedom of choice of a more substantial thickness for this layer, which can therefore more readily be obtained in a reproducible and also less critical manner to be used as an etch stopper.

SUMMARY

In fact, according to the invention, a method of manufacturing a semiconductor device of the kind defined in the introductory paragraph, is characterized in that use is made of a first insulating layer having a thickness exceeding that which permits obtaining an electrical conduction between the first and second polycrystalline layers; in that, after having carried out the ion implantation of the weakly doped parts of the source and drain regions, the parts of the first insulating layer situated outside the gate islands are removed by etching; and in that then a third polycrystalline layer is deposited on the assembly, which is rendered conducting by doping before the insulating spacers are formed.

According to the method of the invention, the electrical continuity in the widened gate islands is ensured by small parts of the third polycrystalline layer, which subsist at the periphery of the islands and are in contact on the one hand with the surface of the remaining part of the second polycrystalline layer of the islands and on the other hand with the part of the first polycrystalline layer situated under the insulating spacers. Therefore, it is no longer necessary to choose a first insulating layer having a thickness so small that this layer is conducting and the result is a readily reproducible process.

Another advantage of the method according to the invention is that the insulating gate layer is protected by at least one polycrystalline layer for the major part of the process of manufacturing the device.

Use is advantageously made of a first insulating layer having a thickness greater than 5 nm and preferably below 20 nm, for example 10 nm, and of a second insulating layer having a thickness greater than 40 nm. Thus, the first insulating layer outside the gate islands can be removed without the use of an etching mask while maintaining a part of the thickness of the second insulating layer above the gate islands because it is markedly thicker and can be maintained by limiting the duration of the etching treatment.

The part of the second insulating layer then subsisting is used later as an etch stopper when the major part of the third polycrystalline layer is removed.

The method according to the invention therefore has the advantage that it can still be carried out in a simple manner even if all the insulating layers are formed from the same material, for example silicon oxide.

According to a variation of the method of the invention, the insulating gate layer and the first and third insulating layers are formed from silicon oxide, while the second insulating layer is composed of a layer of silicon oxide covered with a layer of silicon nitride. The first insulating layer can then be removed outside the gate islands in a selective manner and the integrity of the second insulating layer above the gate islands can be maintained in a reliable manner.

The method according to the invention permits of providing the contact connections on the device by opening contact windows located by means of a photosensitive mask according to well known conventional techniques.

However, it is also desirable that the contact connections can be provided on the device by a self-alignment technique utilizing inter alia a metal silicide, which would not require a mask for the formation of the contact windows.

It is then possible to obtain a substantial reduction of the dimensions of the transistors and to increase the integration density of the devices having a very large number of elements.

This possibility is obtained according to a particular embodiment of the invention, which is characterized in that after the formation of the insulating spacers, the removal by selective etching of the unprotected polycrystalline material is prolonged by a given duration under isotropic etching conditions so as to form grooves in the unprotected parts of the first and third polycrystalline layers, and in that these grooves are then filled with a particular insulating material which has selective etching properties relative to the other insulating layers already present on the device by the successive operations of depositing a layer of such material and of anisotropically etching the major part of the layer situated outside the grooves. This operation of filling the grooves could, for example, be carried out with silicon nitride.

Contact windows can then be opened selectively on the parts of the device which have silicon oxide at the surface, while at the periphery of these regions strips of the said particular insulating material subsist, which form a necessary lateral insulation between the contact surfaces formed on the active regions.

In order that the invention may be readily carried out, it will now be described more fully, by way of example, with reference to the accompanying drawings.

DESCRIPTION OF EMBODIMENTS

For the sake of clarity of the figures, the proportions of the dimensions are not taken into account and more particularly in the direction of thickness given dimensions have been considerably increased. In general, the constitutive elements which are homologous in the different Figures are provided with like reference symbols.

Figure 1:
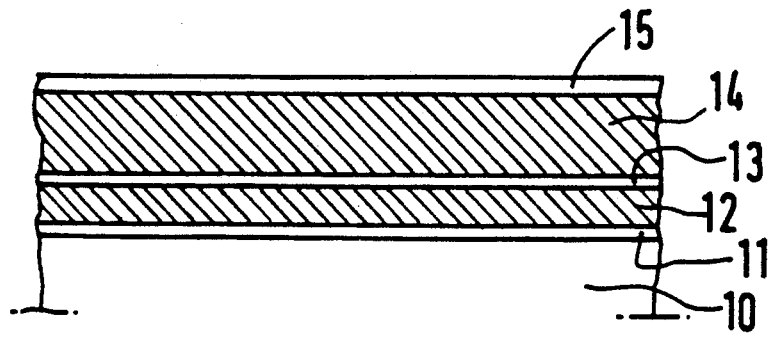
FIGS. 1, 2, 3, 4, and 5 show diagrammatically in sectional view a part of a MIS device illustrating different stages of the method according to the invention in a first embodiment.

FIG. 1 shows a superficial part of a semiconductor body 10, especially of p-type silicon, on which is disposed an insulating gate layer 11, preferably of silicon oxide, having a thickness of approximately 20 nm. A first polycrystalline layer 12 having a thickness of 50 nm has then been deposited on the insulating gate layer 11, which polycrystalline layer 12 has been rendered conducting by doping at a high concentration according to a conventional technique, especially by doping at the instant of deposition.

At the surface of the first polycrystalline layer 12, a thin first insulating layer 13 has then been formed, consisting of silicon oxide with a thickness of 10 nm and intended to serve later as an etch stopper. A second polycrystalline layer 14 has then been deposited on the assembly of the surface, which layer is also rendered conducting by doping. The second polycrystalline layer 14 is thicker than the first polycrystalline layer and has, for example, a thickness of 200 nm. On the assembly is then formed a second insulating layer 15, which is thicker than the first insulating layer 13 and has a thickness exceeding 40 nm, for example, 60 nm. The second insulating layer 15 can be obtained by thermal oxidation of the second polycrystalline layer or by chemical vapour-phase deposition of a layer of silicon oxide.

Figure 2:
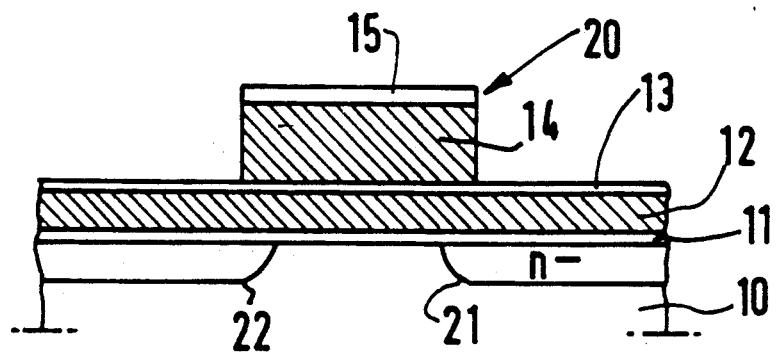

As indicated in FIG. 2, a local etching treatment of the second insulating layer 15 and of the second polycrystalline layer 14 is then carried out so as to form gate islands 20 by using conventional masking and etching techniques. It should be noted that the invention more particularly relates to the manufacture of MIS transistors of which the lateral dimension of the gate islands 20 is close to or less than 1 µm.

Subsequently, a doping at low concentration of the n-type is then obtained by ion implantation to form weakly doped parts 21 and 22 of the source and drain regions, which implantation is effected through the first insulating layer 13, the first polycrystalline layer 12 and the insulating gate layer 11 while using the gate island 20 as a protection mask against the implantation. This implantation is realized, for example, with phosphorus ions in a dose of $4 \times 10^{13}$ at/cm$^2$ at an energy of 70 keV.

Figure 3:
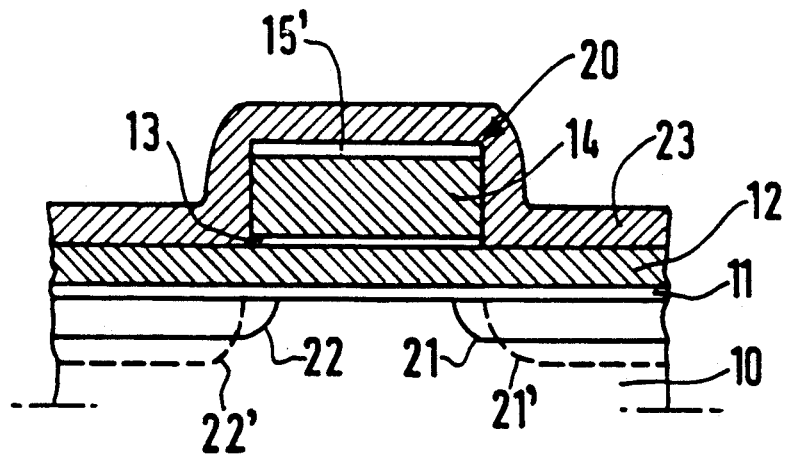

Parts of the first insulating layer 13 situated outside the gate islands 20 are then removed by etching, as shown in FIG. 3, and a third polycrystalline layer 23 rendered conducting by doping is then deposited on the assembly thus formed. Advantageously, the third polycrystalline layer 23 has a thickness lying between 30 and 100 nm and preferably close to 50 nm.

According to the method in accordance with the invention and as appears from the following part of the description, the electrical continuity in the interior of the gate island between the first polycrystalline layer 12 and the second polycrystalline layer 14 is not obtained by the conduction through the first insulating layer 13, but is obtained on the contrary by means of the third polycrystalline layer 23. The thickness of the first insulating layer 13 can therefore be chosen to be larger than that permitting the electrical conduction to be obtained and is advantageously of the order of, for example, 10 nm. With respect to the known method, this first insulating layer 13 therefore fulfills more effectively its function of an etch stopper during the formation of the gate islands 20 at the end of the etching treatment of the second polycrystalline layer 14 and it is obtained in a less critical manner.

The removal of the first insulating layer 13 outside the gate islands 20 can be effected without using a mask due to the fact that the second insulating layer 15 is considerably thicker than the first insulating layer 13 and that an etching treatment of controlled duration permits of removing completely the first insulating layer 13 outside the gate islands 20 while leaving a part 15' of the second insulating layer 15 at the surface of the gate islands 20.

In order that the third polycrystalline layer 23 covers suitably the edges of the gate islands 20, for this purpose a deposition method is used ensuring a good surface coverage, inclusive of the topographic reliefs, for example, a low-pressure chemical vapour-phase deposition (LPCVD).

Taking into account the widening of the gate islands 20 due to the thickness of the third polycrystalline layer 23, the method according to the invention offers a very interesting possibility of carrying out at this stage and by ion implantation a complementary doping of the source and drain zones of the MIS transistor, as shown in FIG. 3 by the dotted lines 21' and 22', which doping is higher than the doping of the parts 21 and 22, but is lower than that of the highly n+ doped parts, which will later be formed. This operation can be carried out with phosphorus ions in a dose of $2 \times 10^{14}$ at/cm$^2$ at an energy of 70 keV.

Figure 4:
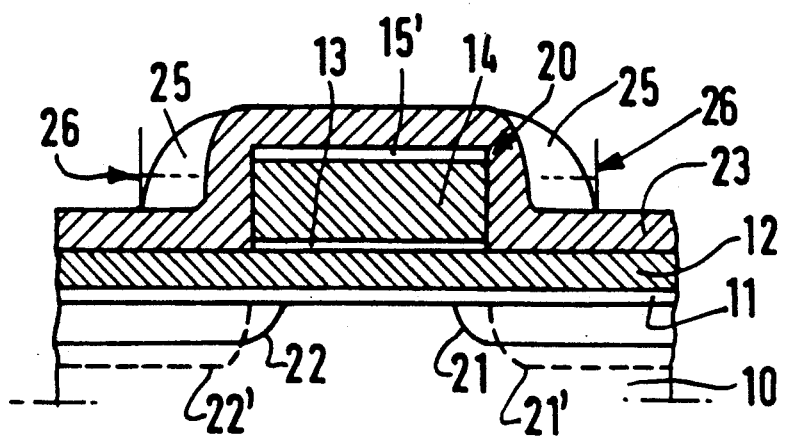

FIG. 4 shows the result of the subsequent steps of the method consisting in the formation of insulating spacers 25 on the edges of the gate islands 20 according to a known technique utilizing the deposition of a third insulating layer having a comparatively large thickness for example 200 nm and made of silicon oxide followed by an anisotropic etching of the major part of this layer, which technique need not be described here in greater detail. The insulating spacers 25 limit at their periphery widened gate islands 26.

Figure 5:
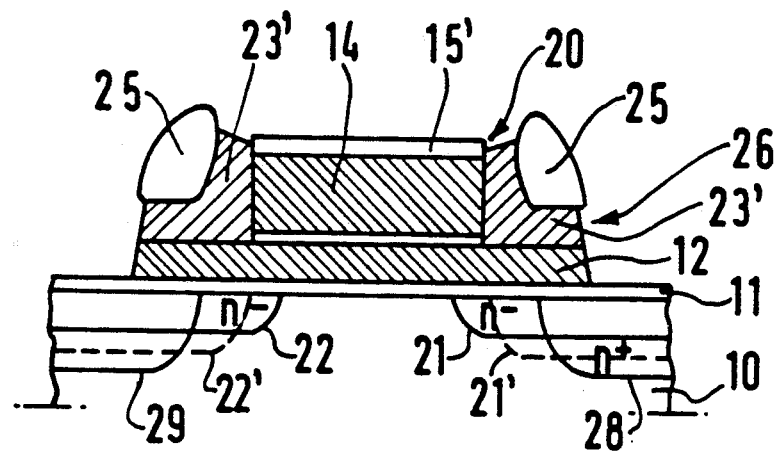

The following operation shown diagrammatically in FIG. 5 consists of removing by selective anisotropic etching the polycrystalline material exposed at the surface, i.e. the first and third polycrystalline layers outside the widened gate islands 26 and the part of the third polycrystalline layer situated above the gate islands 20. This etching can take place by means of a plasma rich in chlorine. During this etching operation, which can be carried out without a mask, the insulating gate layer 11, the insulating spacers 25 and the part of residual thickness of the second insulating layer 15', which elements are made of silicon oxide, constitute an etch stopper at their respective positions. Of the third polycrystalline layer 23 only small parts 23' in the form of an L subsist, which are situated at the periphery of the gate islands and are in electrical contact on the one hand with the surface of the remaining part of the second polycrystalline layer 14 of the islands and on the other hand with the part of the first polycrystalline layer 12 situated under the insulating spacers 25. Subsequently, the doping of the highly doped regions 28 and 29 of the source and drain regions of the MIS transistors of the n+ type is effected by ion implantation with the use of the widened gate islands 26 as an implantation mask. This implantation can be realized with arsenic in a dose of $2 \times 10^{15}$ at/cm$^2$ at an energy of 100 keV. FIG. 5 thus shows the device as it appears at this stage of the operations preceding the step of finishing the device, especially by providing the contact connections with the active regions of the device (its source, drain and gate). It should be noted that in this Figure the parts of the source and drain regions having different dopings 21,21', 28-22, 22',29 are presented in a stepped manner laterally in the order suitable to favour a high breakdown voltage of the diode from drain to substrate and to reduce the emission of charge carriers of high energy when passing the junction, while permitting at the same time an improved stability in the long term of the electrical characteristics of the device.

From the stage of the method as shown in FIG. 5, the device can be finished by opening contact windows located by means of a photosensitive mask according to conventional known techniques, which need not be described here in greater detail.

Figure 6:
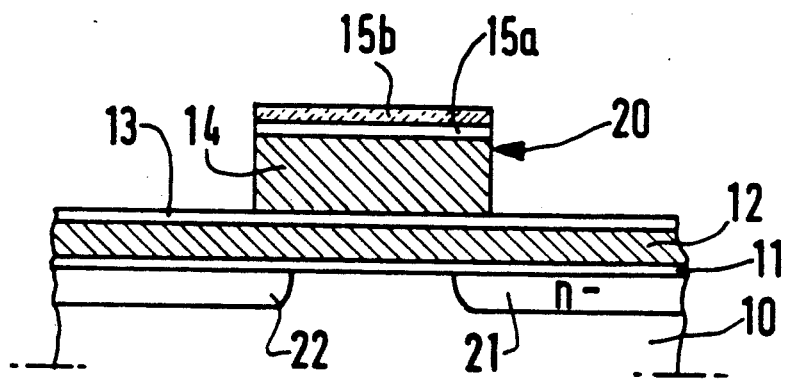
FIG. 6 is a view analogous to FIG. 2 illustrating a variation of the embodiment of the invention.

FIG. 6 shows a variation of the method just described, in which the second insulating layer is composed of a silicon oxide layer 15a covered by a silicon nitride layer 15b. With respect to the method described hereinbefore with reference to FIG. 1, the variation now described therefore consists in adding the silicon nitride layer 15b, whose thickness may be chosen, for example, to be approximately 50 nm. FIG. 6, which shows the device at a stage equivalent to that of FIG. 2 in the method described hereinbefore, shows that the parts of the first insulating layer 13 of silicon oxide can be etched selectively with respect to the silicon nitride layer 15b subsisting above the gate island 20. This etching can be obtained by wet etching in a buffered solution of hydrofluoric acid and ammonium fluoride. Due to this etching selectivity, the second insulating layer 15a,15b situated above the gate islands 20 can be maintained integrally and the part 15a of the second insulating layer formed from silicon oxide can then be used in a reliable manner as an etch stopper for selectively removing the polycrystalline layers after the formation of the insulating spacers.

FIGS. 7 to 10 show another embodiment of the invention permitting providing metallic contact connections on the device by a self/alignment technique, especially by the use of metallic silicide.

Figure 7:
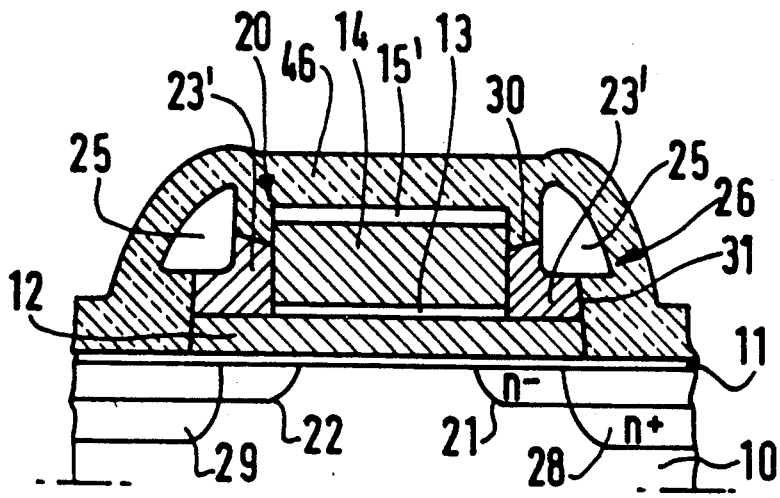
FIGS. 7, 8 and 9 show diagrammatically in sectional view another embodiment of the invention.

The first stages of the method as described with reference to FIGS. 1 to 5 remain the same. As shown in FIG. 7, the removal by selective etching of the unprotected polycrystalline material is prolonged for a given duration and under isotropic etching conditions so as to form grooves 30 in the third polycrystalline layer between the spacers 25 and the remaining part of the second insulting layer 45, and grooves 31 in the first and third polycrystalline layers at the periphery of the widened gate islands 26 under the insulating spacers 25. Preferably, the etching of the polycrystalline materials is effected in two steps; the first step of reactive ion etching (RIE) in a chlorine-based plasma for removing the polycrystalline material without forming grooves and the second step of isotropic etching, either dry etching in a plasma of fluorine or wet etching in, for example, a solution of hydrofluoric acid and nitric acid. It should be noted that the formation of the grooves 31 influences the extent of the gate electrode of the MIS transistor in combination with the lateral extent of the n+ doping of the source and drain regions 28/29 and can permit obtaining an optimum distribution of the electric field at the drain junction favouring a high breakdown voltage of this junction.

After the formation by ion implantation of the highly doped parts 28 and 29 of the source and drain regions with the use of the widened gate islands 26 as an implantation mask, which doped parts can be obtained in the same manner as described hereinbefore, the assembly of the structure is covered by a silicon nitride layer 46 having a sufficient thickness to fill at least the grooves 30 and 31. The method used to deposit the silicon nitride layer 46 must be chosen to provide a good coverage of the topographic relief, for example the low pressure chemical vapour-phase deposition method. By way of example, the silicon nitride layer 46 is deposited with an average thickness of 300 nm.

Instead of silicon nitride, other insulating materials can also be used to form layer 46. The only important point is that the insulating material chosen for this purpose should possess selective etching characteristics in such a way that the layer 46 remains present when the silicon oxide is etched away during the ensuing stage of the process.

Figure 8:
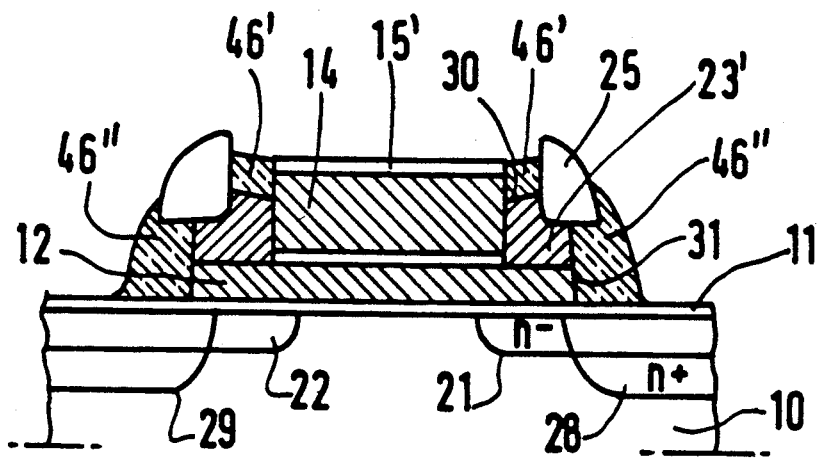

Subsequently, as indicated in FIG. 8, the major part of the silicon nitride layer 46 is removed while leaving only the parts 46',46" filling the grooves 30 and 31, respectively. This operation of removing the silicon nitride is similar to that used for forming spacers 25 of silicon oxide. It can be carried out by reactive ion etching in a chlorine-based plasma, which is highly selective with respect to silicon oxide.

In this operation, the insulating ate layer 11, the insulating spacers 25 and the parts of the second insulating layer 45 on gate islands 20, all three of silicon oxide, constitute etch stoppers in the respective zones protected by these layers.

Figure 9:
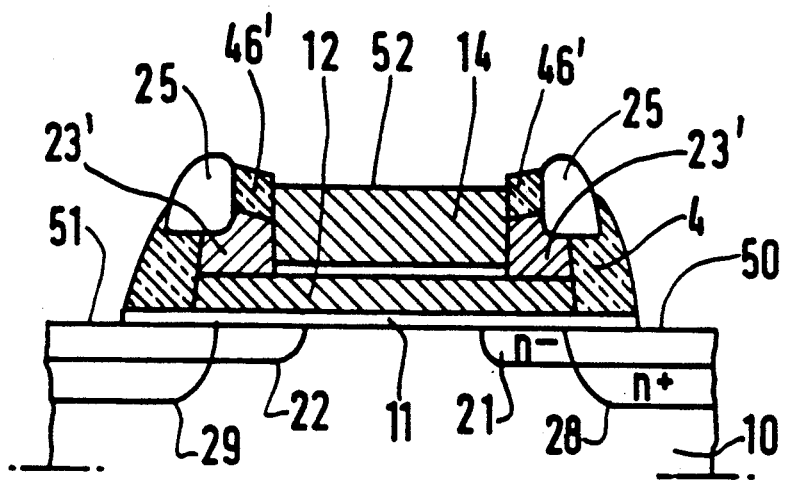

It is now possible to remove by selective etching the exposed parts of the insulating gate layer 11 of silicon oxide and of the second insulating layer 45 covering the gate islands 20 without using a mask. The electrical insulation between the different active regions of the transistors: source, drain, gate, is obtained by the maintained parts 46',46" of the silicon nitride layer 46 subsisting after this selective etching of the regions covered by oxide. As is shown in FIG. 9, it is possible by limiting the etching time of the silicon oxide to maintain a sufficient part of the insulating spacers 25, thus ensuring an insulation of the parts of the third polycrystalline layer 23' between the parts 46' and 46" of the silicon nitride layer 46. The source contact, drain and gate zones 50, 51 and 52, respectively are now covered and are available to form metallic contacts on the device according to a known self-aligning technique, for example by using a silicide such as titanium silicide. In order to increase the integration density it may be necessary to provide contacts on the source and drain silicide layers, which also project partly over the gate island 20, though without making contact with it.

In that case the contact with the gate island 20 is effected at another location, removed from the sectional plane of the Figures.

This provision (not shown in the drawings) can also be made with the process according to the invention in an embodiment thereof using self-aligned contacts covered with a metal silicide.

It is sufficient for this to make the second insulating layer 15 markedly thicker in certain locations which have to become protected by a metallic contact.

This is easily achieved when the second insulating layer 15 is applied in two steps: a first deposition step for a layer of considerable thickness, for example 250 nm of silicon oxide, which is retained exclusively at locations to be protected, by means of localized etching, followed by a second deposition step for a 60 nm thick silicon oxide layer covering the assembly of the device.

By limiting the etching time of the second insulating layer 15 to a suitable value, during the process stage described hereinbefore with reference to FIG. 9, it is easy to achieve that certain portions of gate island 20 remain protected by the oxide (where the first insulating layer was provided with greater thickness), while other, non-protected portions are denuded and thus become available for contacting by means of a metal silicide.

I claim:

1. A method of manufacturing a semiconductor device comprising at least one transistor of the MIS type having a drain region and a source region each comprising a weakly doped part and a highly doped part slightly offset laterally with respect to the preceding part as well as a gate electrode covering the weakly doped part and extending laterally to the highly doped part, in which method there are successively effected on a semiconductor body covered by an insulating gate layer:

a deposition of a first polycrystalline layer conducting by doping, the formation of a first insulating thin layer for later use as an etch stopper, a deposition of a second polycrystalline conducting layer which is thicker than the first polycrystalline layer, the formation of a second insulating layer which is thicker than the first insulating layer, the definition of gate islands by local etching of the second insulating layer and of the second polycrystalline layer outside the islands, the ion implantation of the weakly doped parts of the source and drain regions while using the gate islands as an implantation mask, the formation of insulating spacers on the edges of the gate islands by a deposition of a third insulating layer followed by an anisotropic etching of the major part of this layer, the insulating spacers limiting at their periphery widened gate islands, the removal by selective etching of the polycrystalline material exposed outside the widened gate islands, the ion implantation of the highly doped parts of the source and drain regions while using the widened gate islands as an implantation mask, and then the operations of finishing the deVice necessary for providing the contact connections and the interconnection with the active regions and with the gates of the transistors is characterized in that use is made of a first insulating layer having a thickness exceeding that which permits obtaining an electrical conduction between the first and second polycrystalline layers; in that, after having carried out the ion implantation of the weakly doped parts of the source and drain regions, the parts of the first insulating layer situated outside the gate islands are removed by etching; and in that then a third polycrystalline layer is deposited on the assembly, which is rendered conducting by doping before the insulating spacers are formed.

2. A method as claimed in claim 1, characterized in that additional parts of the drain and source regions having an intermediate doping are formed by ion implantation after the deposition of the third polycrystalline layer and before the formation of the insulating spacers.

3. A method as claimed in claim 2, characterized in that use is made of a first insulating layer having a thickness greater than 5 nm and preferably below 20 nm, and of a second insulating layer having a thickness greater than 40 nm.

4. A method as claimed in claim 3, characterized in that the thickness of the third 1, polycrystalline layer lies between 30 and 100 nm and is preferably approximately 50 nm.

5. A method as claimed in any claim 4, characterized in that the insulating gate layer and the first, second and third insulating layers are formed from silicon oxide.

6. A method as claimed in claim 5, characterized in that after the formation of the insulating spacers, the removal by selective etching of the unprotected polycrystalline material is prolonged by a given duration in isotropic etching conditions so as to form grooves in the unprotected parts of the first and third polycrystalline layers, and in that these grooves are filled with a particular insulating material which has selective etching properties relative to the other insulating layers already present on the device by the successive operations of depositing a layer of such material and of anisotropically etching the major part of this layer situated outside the groves.

7. A method as claimed in claim 6, characterized in that the particular insulating material is silicon nitride, and in that the deposited layer of this insulating material has a thickness of approximately 100 nm.

8. A method as claimed in claim 4, characterized in that the insulating gate layer and the first and third insulating layers are formed from silicon oxide, while the second insulating layer is composed of a silicon oxide layer covered by a silicon nitride layer.

9. A method as claimed in claim 8, characterized in that after the formation of the insulating spacers, the removal by selective etching of the unprotected polycrystalline material is prolonged by a given duration in isotropic etching conditions so as to form grooves in the unprotected parts of the first and third polycrystalline layers, and in that these grooves are then filled with a particular insulating material which has selective etching properties relative to the other insulating layers already present on the device by the successive operations of depositing a layer of such material and of anisotropically etching the major part of this layer situated outside the grooves.

10. A method as claimed in claim 9, characterized in that the particular insulating material is silicon nitride, and in that the deposited layer of this insulating material has a thickness of approximately 100 nm.

11. A method as claimed in claim 1, characterized in that use is made of a first insulating layer having a thickness greater than 5 nm and preferably below 20 nm, and of a second insulating layer having a thickness greater than 40 nm.

12. A method as claimed in claim 1, characterized in that the thickness of the third polycrystalline layer lies between 30 and 100 nm and is preferably approximately 50 nm.

13. A method as claimed in claim 1, characterized in that the insulating gate layer and the first, second and third insulating layers are formed from silicon oxide.

14. A method as claimed in claim 13, characterized in that after the formation of the insulating spacers, the removal by selective etching of the unprotected polycrystalline material is prolonged by a given duration in isotropic etching conditions so as to form grooves in the unprotected parts of the first and third polycrystalline layers, and in that these grooves are then filled with a particular insulating material which has selective etching properties relative to the other insulating layers already present on the device by the successive operations of depositing a layer of such material and of anisotropically etching the major part of this layer situated outside the grooves.

15. A method as claimed in claim 14, characterized in that the particular insulating material is silicon nitride, and in that the deposited layer of this insulating material has a thickness of approximately 100 nm.

16. A method as claimed in claim 1, characterized in that the insulating gate layer and the first and third insulating layers are formed from silicon oxide, while the second insulating layer is composed of a silicon oxide layer covered by a silicon nitride layer.

17. A method as claimed in claim 16, characterized in that after the formation of the insulating spacers, the removal by selective etching of the unprotected polycrystalline material is prolonged by a given duration in isotropic etching conditions so as to form groove in the unprotected parts of the first and third polycrystalline layers, and in that these grooves are then filled with a particular insulating material which has selective etching properties relative to the other insulating layers already present on the device by the successive operations of depositing a layer of such material and of anisotropically etching the major part of this layer situated outside the grooves.

18. A method as claimed in claim 17, characterized in that the particular insulating material is silicon nitride, and in that the deposited layer of this insulating material has a thickness of approximately 100 nm.

* * * * *